United States Patent
Zhang et al.

(10) Patent No.: US 10,418,584 B2
(45) Date of Patent: Sep. 17, 2019

(54) METHOD OF SEALING DISPLAY PANEL, DISPLAY PANEL AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Liang Zhang, Beijing (CN); Fuyi Cui, Beijing (CN); Shanshan Bao, Beijing (CN); Ang Xiao, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/277,204

(22) Filed: Sep. 27, 2016

(65) Prior Publication Data
US 2017/0256736 A1  Sep. 7, 2017

(30) Foreign Application Priority Data
Mar. 1, 2016  (CN) .......................... 2016 1 0116039

(51) Int. Cl.
 H01L 51/52  (2006.01)
 H01L 51/56  (2006.01)

(52) U.S. Cl.
 CPC ...... *H01L 51/5237* (2013.01); *H01L 51/5246* (2013.01); *H01L 51/56* (2013.01)

(58) Field of Classification Search
CPC combination set(s) only.
See application file for complete search history.

(56) References Cited

U.S. PATENT DOCUMENTS

| | | | |
|---|---|---|---|
| 7,452,258 B1 | 11/2008 | Marzen et al. | |
| 2007/0194304 A1 | 8/2007 | Zu et al. | |
| 2010/0259707 A1* | 10/2010 | Iwata | G02F 1/133351 349/73 |
| 2014/0138667 A1 | 5/2014 | Hibino et al. | |

(Continued)

FOREIGN PATENT DOCUMENTS

| | | |
|---|---|---|
| CN | 101026182 A | 8/2007 |
| CN | 104299981 A | 1/2015 |

(Continued)

OTHER PUBLICATIONS

First Chinese Office Action dated Mar. 2, 2017; Appln. No. 201610116039.9.

*Primary Examiner* — Matthew L Reames
(74) *Attorney, Agent, or Firm* — Ladas & Parry LLP

(57) ABSTRACT

A sealing method of display panel, comprising: forming closed inner sealant layer in a sealing region of a first substrate; forming outer sealant layer which encloses the inner sealant layer, in which a communicating region is provided, the communicating region is configured to communicate a region between the inner sealant layer and the outer sealant layer and a region outside the outer sealant layer; affixing a second substrate to the first substrate in position to form a motherboard; and sealing the communicating region after cutting out the display panel from the motherboard. A display panel and a display device are also disclosed.

12 Claims, 6 Drawing Sheets

(56) References Cited

U.S. PATENT DOCUMENTS

2016/0254491 A1  9/2016  Wang et al.
2016/0315282 A1  10/2016  Qian

FOREIGN PATENT DOCUMENTS

| CN | 104659269 A | 5/2015 |
|----|-------------|--------|
| WO | 2011/004567 A1 | 1/2011 |
| WO | 2013/031509 A1 | 3/2013 |
| WO | 2013/031733 A1 | 3/2013 |

* cited by examiner

METHOD OF SEALING DISPLAY PANEL, DISPLAY PANEL AND DISPLAY DEVICE

TECHNICAL FIELD

Embodiments of the present disclosure relate to a method of sealing display panel, a display panel and a display device.

BACKGROUND

Organic Light Emitting Diode (abbreviated as OLED) display panel has many advantages such as active illumination, high brightness, high contrast, thin thickness, low power consumption, large viewing angle and wide operating temperature range and becomes a new advanced flat panel display device having various applications.

There is an organic material layer which is very sensitive to moisture and oxygen in the current OLED device, which greatly reduces the life time of the OLED device. To solve this problem, a sealant sealing process for isolating the organic material layer from the environment is mainly utilized. The sealant sealing process comprises forming sealant at an edge of a sealing cover plate by screen print, and then irradiating and heating the sealant by laser after the sealant being prebaked so that the sealant is melted and bonds the sealing cover plate and the array substrate.

Conventional arts utilize a single-layered sealant sealing technology. After the sealing cover plate and the array substrate are affixed, pressure within the cell is 1 kPa. During a test under high temperature and high pressure in which the environment is under 2 atmospheric pressures, the pressure difference between the inside and outside of the cell is approximately 2 atmospheric pressures, which results in a relatively high impact on the sealant during the test, so that the sealant is inclined to be destroyed and the organic material layer is corrupted and the product has malfunction.

SUMMARY

At least one embodiment of the disclosure provides A sealing method of display panel, comprising:

forming closed inner sealant layer in a sealing region of a first substrate;

forming outer sealant layer which encloses the inner sealant layer, in which a communicating region is provided, the communicating region is configured to communicate a region between the inner sealant layer and the outer sealant layer and a region outside the outer sealant layer;

affixing a second substrate to the first substrate in position to form a display panel; and sealing the communicating region after cutting out the display panel from the motherboard.

At least one embodiment of the disclosure provides a display panel comprising:

a first substrate and a second substrate which are oppositely disposed;

an inner sealant layer and an outer sealant layer, which are disposed in a package region of the first substrate and the second substrate, wherein the outer sealant layer is disposed to enclose the inner sealant layer, and an air pressure in a region between the inner sealant layer and the outer sealant layer is 1 atmospheric pressure.

At least one embodiment of the disclosure provides a display device, comprising the display panel described above.

In the sealing method of display panel according to the embodiments of the disclosure, sealing is achieved by providing an inner sealant layer and an outer sealant layer, and since a communicating region is provided in the outer sealant layer, the external environment is in communication with a region between the inner sealant layer and the outer sealant layer and the air pressure between the two sealant layers is made to be 1 atmospheric pressure after cutting out a display panel from the motherboard. And further, the air pressure between the two sealant layers is kept at 1 atmospheric pressure after sealing the communicating region. When carrying out a test of high temperature and high pressure and the air pressure of the external environment is close to 2 atmospheric pressures, the pressure difference between two sides of the outer sealant layer is close to 1 atmospheric pressure and the pressure difference between two sides of the inner sealant layer is also close to 1 atmospheric pressure. Comparing with the conventional art, the pressure difference between the two sides of the sealant is reduced, and thus the impact on the sealant is reduced and the package performance of the display panel is improved.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

REFERENCE SIGNS

21: first substrate, 22: outer sealant layer; 23: inner sealant layer, 24: communicating region, and 25: region between the inner sealant layer and the outer sealant layer.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
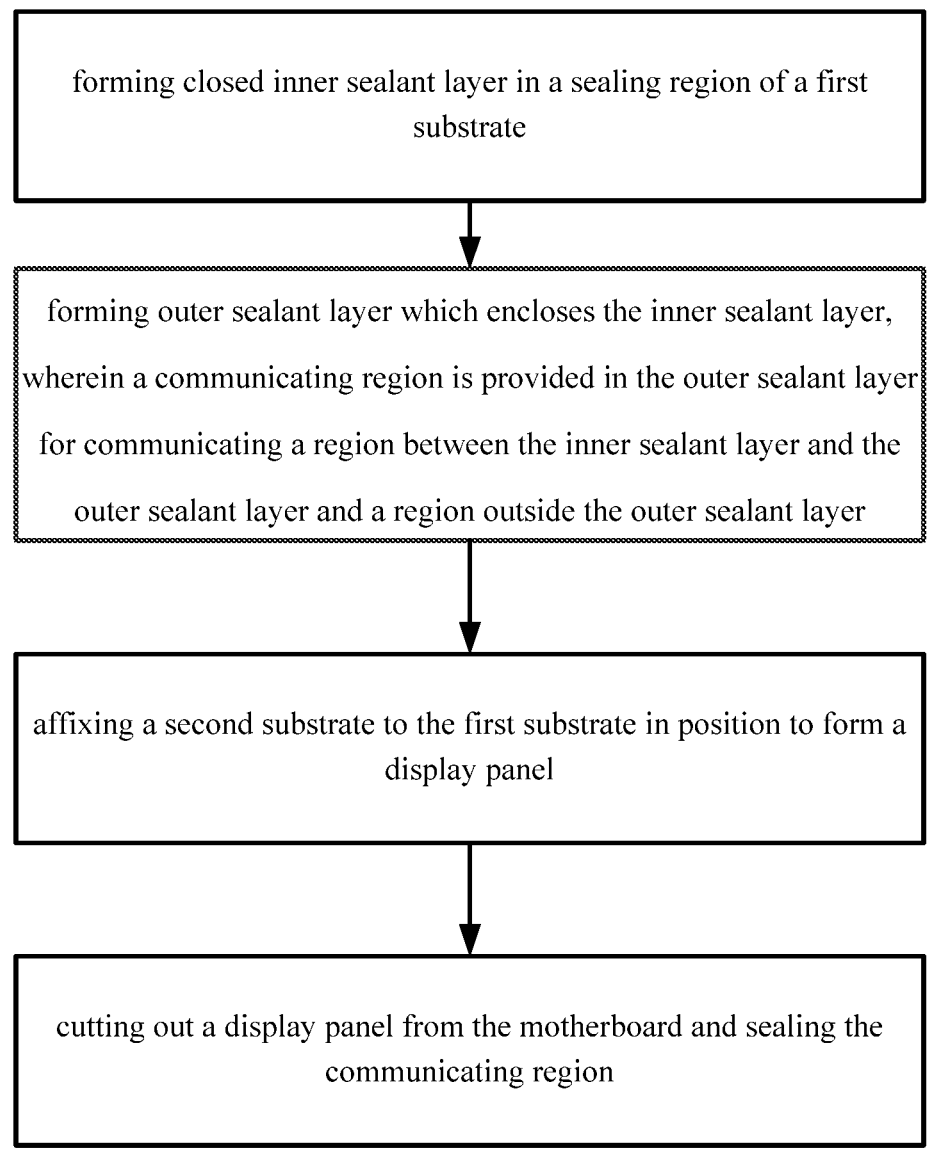
FIG. 1 is an illustrative flow chart of a method of sealing display panel according to an embodiment of the present disclosure.

Referring to FIG. 1 which is an illustrative flow chart of a method of sealing display panel according to an embodiment of the present disclosure, the method of sealing display panel comprises:

forming closed inner sealant layer 23 in a sealing region S of a first substrate 21;

forming outer sealant layer 22 which encloses the inner sealant layer 23, wherein a communicating region 24 is provided in the outer sealant layer 22 for communicating a region 25 between the inner sealant layer 23 and the outer sealant layer 22 and a region outside the outer sealant layer 22;

affixing a second substrate 26 (illustrated in FIGS. 3-7) to the first substrate 21 in position to form a display panel 2; and cutting out a display panel 2 from the motherboard 1 and sealing the communicating region 24.

Figure 2:
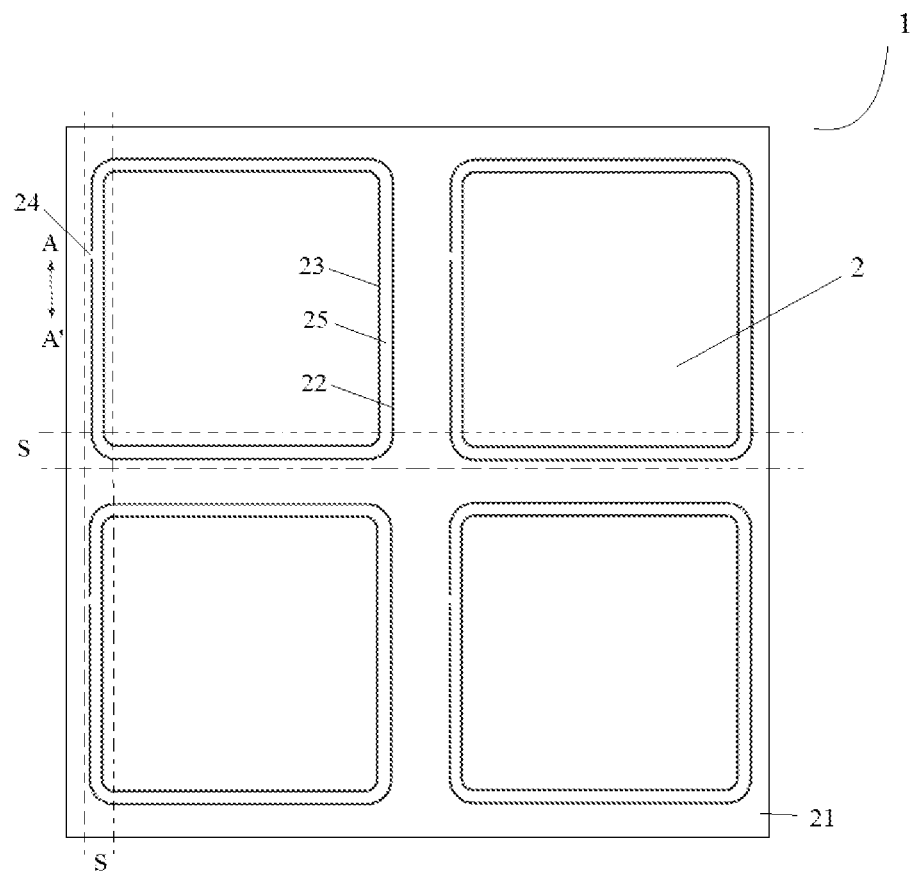
FIG. 2 is an illustrative structural view of a first substrate of the display panel according to an embodiment of the present disclosure.

In this embodiment, as illustrated in FIG. 2, since the communicating region 24 is provided in the outer sealant layer 22, after the display panel 2 is cut out from the motherboard, a region 25 between the inner sealant layer 23 and the outer sealant layer 22 is communicated with the external environment. Therefore, the air pressure between the two sealant layers 22 and 23 is made to be 1 atmospheric pressure. After the communicating region 24 is sealed, the air pressure in the region 25 between the two sealant layers 22 and 23 can be kept to be 1 atmospheric pressure.

During a test under high temperature and high pressure, when the air pressure of the external environment is close to 2 atmospheric pressures, the pressure difference between the external environment and the region 25 between the two sealant layers 22 and 23 is close to 1 atmospheric pressure, in other words, the pressure difference between the two sides of the outer sealant layer 22 is close to 1 atmospheric pressure; and the pressure difference between the region 25 between the two sealant layers 22 and 23 and the internal region enclosed by the inner sealant layer 23 is close to 1 atmospheric pressure, in other words, the pressure difference between the two sides of the inner sealant layer 23 is also close to 1 atmospheric pressure. Comparing with the conventional art in which the pressure difference between the two sides of the sealant is 2 atmospheric pressures, in the present embodiment, the pressure difference between the two sides of the sealant is reduced, and thus the impact on the sealant during the test is reduced and the package performance is improved.

It is to be noted that although the air pressure in the region between the two sealant layers will rise in a high temperature environment, it is experimentally tested that in the high temperature environment of the test, the amplitude of air pressure in the region between the two sealant layers rises by 10% at the maximum. Therefore, it can be ensured that the pressure difference between the two sides of the outer sealant layer is close to 1 atmospheric pressure.

In one embodiment of the present disclosure, before cutting out a display panel 2 from the motherboard 1, both the inner sealant layer 23 and the outer sealant layer 22 are cured.

For example, the inner sealant layer 23 and the outer sealant layer 22 can be cured by laser sintering method and air pressure in the region inside the inner sealant layer 23 is 1 kPa. Curing the inner sealant layer 23 and the outer sealant layer 22, on the one hand, forms a sealing structure in the inner sealant layer 23, while on the other hand, facilitates subsequent blocking and sealing of the outer sealant layer.

Figure 7:
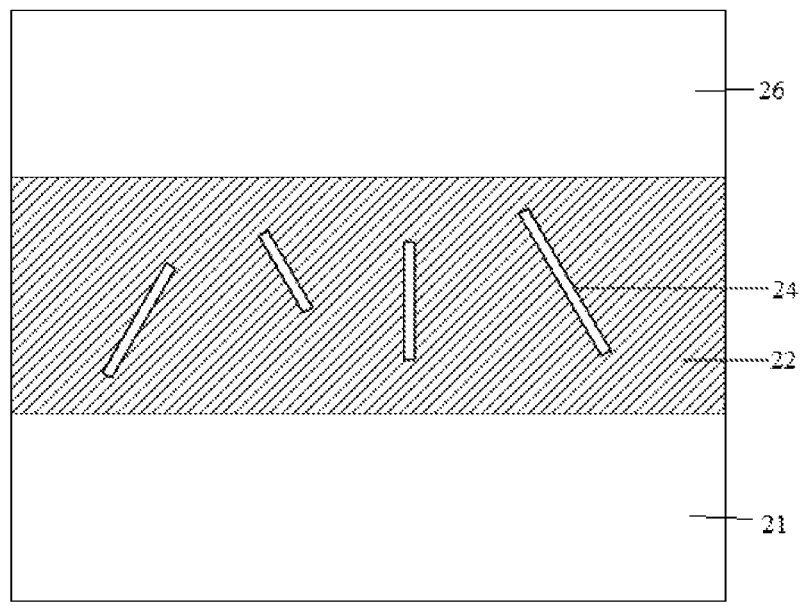

In one embodiment of the present disclosure, sealing the communicating region comprises:

coating the communicating region 25 with blocking sealant 27, as illustrate in FIG. 7;

curing the blocking sealant 27 so as to block the communicating region 24.

The blocking sealant 27 in the present embodiment comprises light curing adhesive. The light curing adhesive can be UV curing adhesive. After the communicating region 24 is coated with the UV curing adhesive, by irradiation of UV light, the blocking sealant 27 is cured. The communicating region 24 can be made small and the blocking sealant 27 can be in liquid state, so that the communicating region 24 can absorb the blocking sealant 27 due to capillarity when the blocking sealant 27 is coated near the communicating region 24. Thus, a good sealing effect is achieved so as to ensure that the environment between the inner sealant layer 23 and the outer sealant layer 22 is in a sealed state.

In one embodiment of the present disclosure, the communicating region 24 comprises at least one of a through hole, a slit and a notching disposed in the outer sealant layer.

Figure 3:
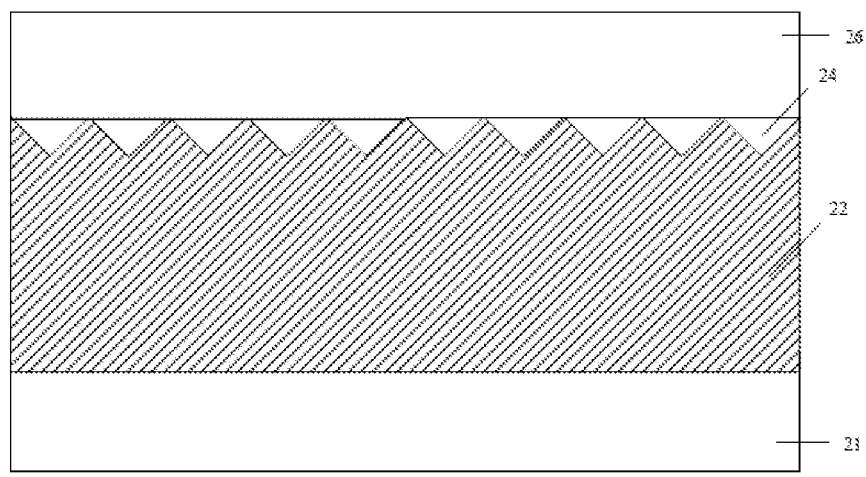
FIG. 3 to FIG. 7 are illustrative sectional views of a communicating region along AA' direction in FIG. 2.
Figure 4:
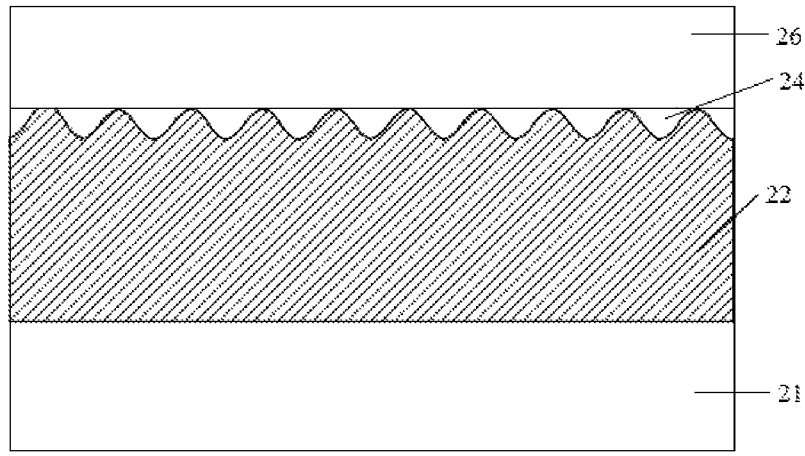

In one embodiment of the present disclosure, when viewed from the direction as indicated by the arrow A-A' in FIG. 2, the communicating region 24 has a structure as illustrated in FIG. 3 or FIG. 4. The outer sealant layer 22 is of zigzag shape (as illustrated in FIG. 3) or wave shape (as illustrated in FIG. 4) on a side close to the second substrate 26, or can be of other regular or irregular shape.

Figure 5:
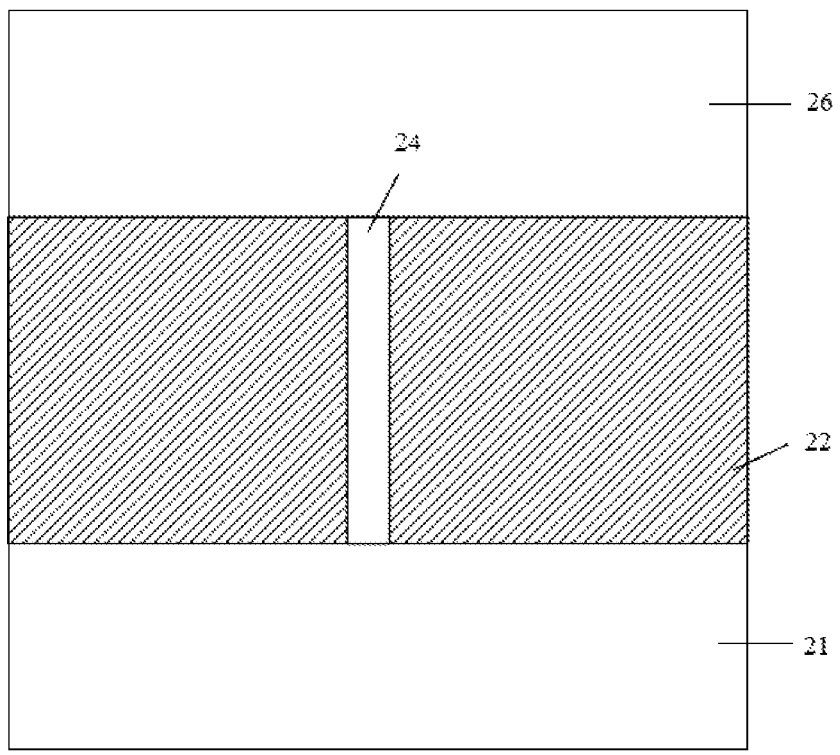

In one embodiment of the present disclosure, the communicating region 24 has a shape of a longitudinal opening 24 traversing the outer sealant layer as illustrated in FIG. 5.

Figure 6:
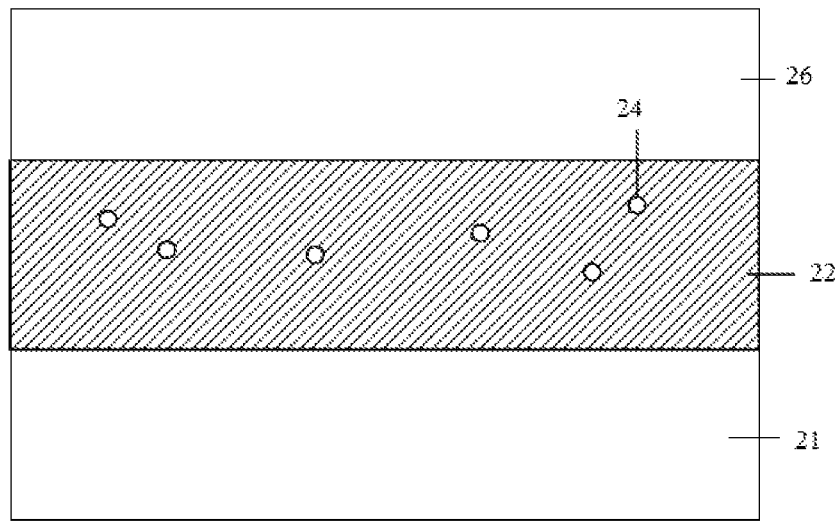

In one embodiment of the present disclosure, the communicating region comprises a plurality of through holes 24 which are distributed in the outer sealant layer 22 in a relatively uniform manner, as illustrated in FIG. 6, so as to ensure that all the regions between the two sealant layers 22 and 23 can be in communication with the external environment well.

In one embodiment of the present disclosure, the communicating region comprises one or more slit(s) 24, as illustrated in FIG. 7, the width of which can be several microns so as to ensure that the slit(s) can make the region between the two sealant layers be in communication with the external environment.

The aforementioned through hole, slit and/or notching can further comprise other similar structure, as long as it can be ensured that the communicating region allows gas circulate so that the external gas can enter the region 25 between the inner sealant layer 23 and the outer sealant layer 22.

Figure 9:
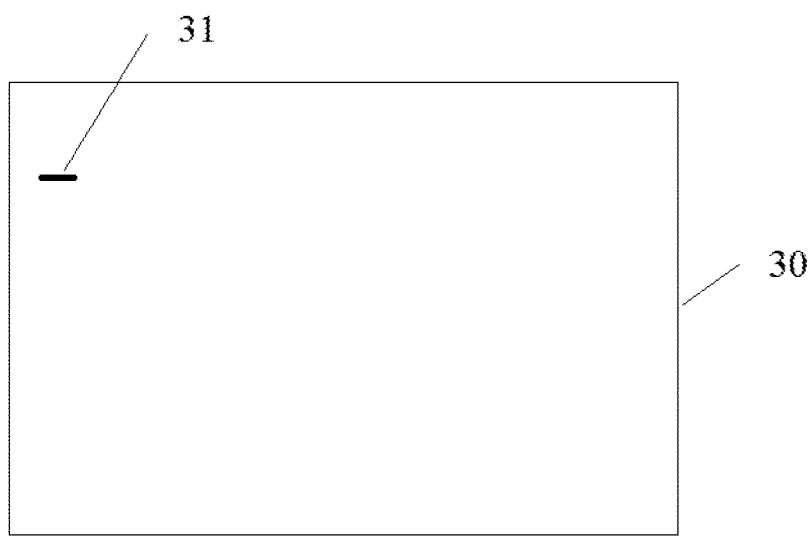
FIG. 9 is an illustrative structural view of a mask for forming the communication region according to an embodiment of the present disclosure.

In one embodiment of the present disclosure, when the communicating region 24 is a notching disposed on the outer sealant layer, forming the outer sealant layer 22 outside the inner sealant layer 23 comprises: providing a shielding bar 31 in a transmissive region of a mask 30, as illustrated in FIG. 9, for forming the outer sealant layer along a thickness direction of the outer sealant layer 22 (i.e., the direction indicated by the arrow A in FIG. 2), so that the thus-formed outer sealant layer 22 forms a communicating region 24 in a position corresponding to the shielding bar 31. By such a method, the communicating region 24 can be conveniently formed to have a special shape.

In one embodiment of the present disclosure, the distance between the outer sealant layer 23 and the inner sealant layer 22 is from 30 microns to 100 microns. By setting the distance between the inner sealant layer 23 and the outer sealant layer 22 to be greater than 30 microns, adhesion of the inner sealant layer 23 and outer sealant layer 22 can be avoided when they are formed. By setting the distance between the inner sealant layer 23 and the outer sealant layer 22 to be less than 100 microns, the package region is prevented from being too wide which would otherwise lead to a wide bezel of the display panel.

Figure 8:
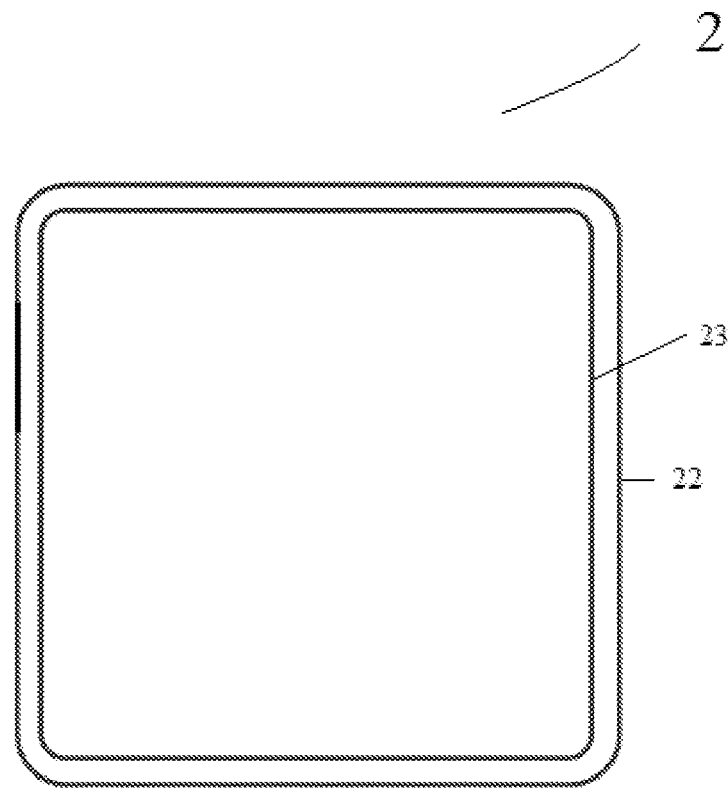
FIG. 8 is an illustrative structural view of a display panel according to an embodiment of the present disclosure after being cut from a mother board.

By use of the above-described sealing method of display panel, at least one embodiment of the present disclosure further provides a display panel 2, as illustrate in FIG. 8. As illustrated in FIG. 2, the display panel comprises a first substrate 21 and a second substrate (as indicated by reference number 22 in FIGS. 3-7) which is disposed opposite to the first substrate 21; an inner sealant layer 23 and an outer sealant layer 22 disposed in a package region between the first substrate 21 and the second substrate 22. The outer sealant layer 22 is disposed to enclose the inner sealant layer 23. The air pressure in a region 25 between the inner sealant layer 23 and the outer sealant layer 22 is 1 atmospheric pressure.

Figure 10:
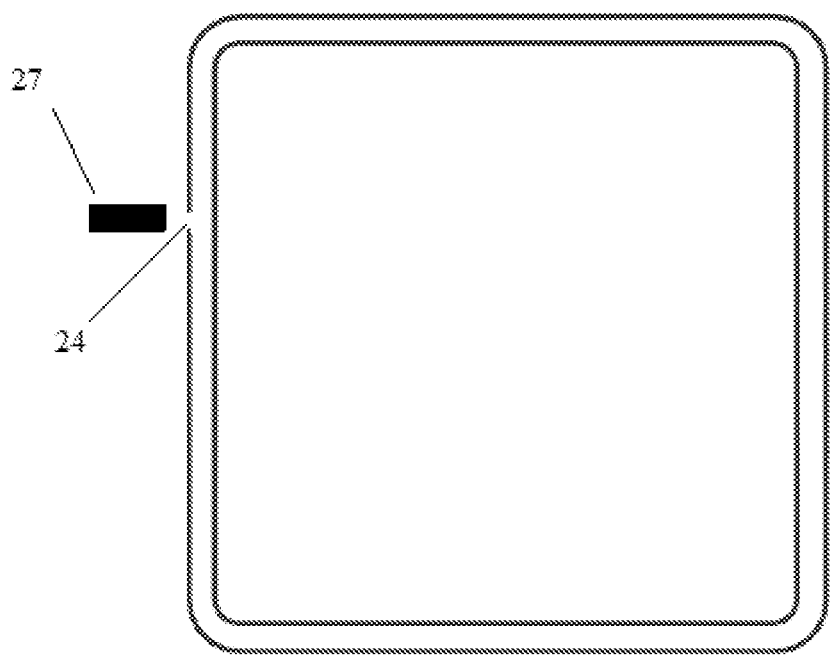
FIG. 10 is an illustrative structural view of coating a communicating region with blocking sealant according to an embodiment of the present disclosure.

In one embodiment of the present disclosure, a communicating region 24 is provided in the outer sealant layer 22 for communicating the region 25 between the inner sealant layer 23 and the outer sealant layer 22 and a region outside the outer sealant layer, as illustrated in FIG. 10. The communicating region 24 is blocked by blocking sealant 27 after the display panel 2 is cut out from the motherboard 1.

In one embodiment of the present disclosure, the communicating region 24 is disposed to comprise at least one of a through hole, a slit and a notching formed in the outer sealant layer 22.

In one embodiment of the present disclosure, the inner sealant layer 23 or the outer sealant layer 22 comprises glass glue and the blocking sealant 27 comprises light curing adhesive.

In one embodiment of the present disclosure, the distance between the outer sealant layer 22 and the inner sealant layer 23 is from 30 microns to 100 microns.

At least one embodiment of the present invention further provides a display device comprising the above-described display panel. The display device provided by the embodiments of the present disclosure can be any product or component having display function such as display screen of laptop computer, display device, television, digital camera, cell phone, tablet PC, and the like.

The technical solutions of the present disclosure have been explained in detail with reference to the drawings. In the conventional art, pressure difference between two sides of the sealant of the display panel in a test environment of high temperature and high pressure is relatively high, as a result of which the sealant is susceptible to damage. By virtue of the technical solutions disclosed by the embodiments of the present disclosure, the inner sealant layer and outer sealant layer are provided to achieve the sealing. When the air pressure of the external environment is close to 2 atmospheric pressures, the pressure difference between two sides of the outer sealant layer is close to 1 atmospheric pressure and the pressure difference between two sides of the inner sealant layer is also close to 1 atmospheric pressure. Comparing with the conventional art, the pressure difference between the two sides of the sealant is reduced, and thus the impact on the sealant is reduced and the package performance of the display panel is improved.

In the present invention, terms of "first" and "second" are used for the purpose of illustration only and should not be construed as indicating or suggesting relative degree in importance. Unless otherwise stated, term of "plurality of" means two or more than two.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201610116039.9 filed on Mar. 1, 2016, the disclosure of which is hereby entirely incorporated by reference as a part of the present disclosure.

The invention claimed is:

1. A sealing method of display panel, comprising:
   forming a closed inner sealant layer in a sealing region of a first substrate;
   forming an outer sealant layer which encloses the closed inner sealant layer, in which a communicating region is provided, the communicating region is configured to communicate a region between the closed inner sealant layer and the outer sealant layer and a region outside the outer sealant layer;
   affixing a second substrate to the first substrate in position to form a motherboard; and
   cutting the motherboard and sealing the communicating region so as to form the display panel.

2. The sealing method according to claim 1, wherein before cutting the motherboard, comprising:
   curing the closed inner sealant layer and the outer sealant layer.

3. The sealing method according to claim 1, wherein the communicating region comprises at least one of a through hole, a slit and a notching disposed in the outer sealant layer.

4. The sealing method according to claim 3, wherein the communicating region comprises a notching disposed close to the second substrate and the notching is of zigzag shape.

5. The sealing method according to claim 3, wherein the communicating region comprises a notching disposed close to the second substrate and the notching is of wave shape.

6. The sealing method according to claim 3, wherein the communicating region comprises a notching disposed close to the second substrate and the notching is of regular or irregular shape.

7. The sealing method according to claim 3, wherein the communicating region comprises a longitudinal opening intersecting the outer sealant layer.

8. The sealing method according to claim 3, wherein the communicating region comprises a plurality of through holes which are distributed in the outer sealant layer in a relatively uniform manner.

9. The sealing method according to claim 3, wherein the slit has a span of several microns.

10. The sealing method according to claim 1, wherein sealing the communicating region comprises:
    coating the communicating region with blocking sealant; and
    curing the blocking sealant to block the communicating region.

11. The sealing method according to claim 10, wherein the inner sealant layer or the outer sealant layer comprises glass glue, and the blocking sealant comprises light curing adhesive.

12. The sealing method according to claim 1, wherein the distance between the outer sealant layer and the inner sealant layer is from 30 microns to 100 microns.

* * * * *